(12) United States Patent
Veeder

(10) Patent No.: US 9,628,105 B1
(45) Date of Patent: Apr. 18, 2017

(54) ELECTRONIC CIRCUIT HAVING DYNAMIC RESISTANCE ELEMENT

(71) Applicant: Senseeker Engineering Inc., Goleta, CA (US)

(72) Inventor: Kenton Veeder, Santa Barbara, CA (US)

(73) Assignee: SENSEEKER ENGINEERING INC., Goleta, CA (US)

( * ) Notice: Subject to any disclaimer, the term of this patent is extended or adjusted under 35 U.S.C. 154(b) by 11 days.

(21) Appl. No.: 14/873,886

(22) Filed: Oct. 2, 2015

(51) Int. Cl.
*H04N 5/374* (2011.01)
*H03M 3/00* (2006.01)
*H04N 5/3745* (2011.01)

(52) U.S. Cl.
CPC .......... *H03M 3/39* (2013.01); *H04N 5/37455* (2013.01)

(58) Field of Classification Search
CPC ..................... H03M 3/39; H04N 5/37455
USPC ...................................................... 250/208.1
See application file for complete search history.

(56) References Cited

U.S. PATENT DOCUMENTS

| | | |
|---|---|---|
| 5,248,971 A | 9/1993 | Mandl |
| 5,659,315 A | 8/1997 | Mandl |
| 6,737,841 B2 * | 5/2004 | Wrathall ............... H02M 3/156 323/282 |
| 7,023,369 B2 | 4/2006 | Bocko et al. |
| 7,615,753 B2 * | 11/2009 | Audebert ............... G01T 1/17 250/370.07 |
| 9,298,120 B2 * | 3/2016 | Hano ............... G03G 15/0266 |

OTHER PUBLICATIONS

Bedabrata Pain, et al., "Low-power low-noise analog circuits for on-focal-plane signal processing of infrared sensors," Proc. SPIE Aerospace and Remote Sensing—Infrared Det. and Inst., vol. 1946, pp. 1-10, 1993.
Eric R. Fossum, et al., "Infrared readout electronics for space science sensors: state of the art and future directions," Proc. SPIE 2020, Infrared Technology XIX, 262, Nov. 1993.
Boyd Fowler, et al., "A CMOS area image sensor with pixel-level A/D conversion," IEEE Int. Solid-State Circ. Conf., Session 13, Neural Networks and Image Sensors, paper TP 13.5, pp. 226-227, 1994.
Boyd Fowler, CMOS Area Image Sensors with Pixel Level A/D Conversion, Ph.D. Dissertation, Stanford University, Oct. 1995.
Christer Jansson, "A high-resolution, compact, and low-power ADC suitable for array implementation in standard CMOS," IEEE Trans. on Cir. and Sys.-1: Fund. Theory and Apps., vol. 42, No. 11, Nov. 1995.

* cited by examiner

*Primary Examiner* — Seung C Sohn
(74) *Attorney, Agent, or Firm* — Hsuanyeh Law Group PC; Hsuanyeh Chang

(57) ABSTRACT

The present disclosure provides a delta-sigma modulator circuit for use in a pixelated image sensor or a readout integrated circuit. In one aspect, the modulator circuit includes a dynamic resistance element configured to have a variable resistance that changes in accordance with a voltage difference across the dynamic resistance element.

31 Claims, 8 Drawing Sheets

ELECTRONIC CIRCUIT HAVING DYNAMIC RESISTANCE ELEMENT

STATEMENT REGARDING GOVERNMENT SPONSORED RESEARCH OR DEVELOPMENT

This invention was made with U.S. Government support under contract number W909MY-14-C-019, awarded by the U.S. Army through its SBIR program (A14-037). The U.S. Government has certain rights in this invention.

TECHNICAL FIELD

The present disclosure relates to an electronic circuit including one or more Delta Sigma modulators, each having a dynamic resistance element. More specifically, the present disclosure relates to a readout electronic circuit including one or more Delta-Sigma modulators used in analog-to-digital converters (ADCs) for digital pixel image sensors.

BACKGROUND

Delta-Sigma ($\Delta\Sigma$) (or Sigma-Delta) modulation ADCs comprise a large family of ADCs used primarily to achieve high dynamic range through oversampling and filtering. In photography or other imaging technology, dynamic range is defined as a ratio of the maximum and minimum measurable light intensities. $\Delta\Sigma$-ADCs are used almost exclusively when greater than 18 bits of resolution are needed for an application.

FIG. 1 schematically illustrates a conventional $\Delta\Sigma$-ADC 100. Referring to FIG. 1, conventional $\Delta\Sigma$-ADC 100 includes a Delta-Sigma Modulator (DSM) 110, a digital filter 120 electrically coupled to DSM 110, and a digital decimator 130 electrically coupled to digital filter 120. $\Delta\Sigma$-ADC 100 receives analog input signal 10 and generates digital output signal 20 from decimator 130. As shown in FIG. 1, DSM 110 comprises a signal subtraction circuit 112, integrator 114, N-bit ADC 116, and N-bit feedback DAC 118.

DSM 110 allows a delayed version of the input signal 10 to pass therethrough, while subtracting a delayed version of the quantization error from the present quantization error (including uncorrelated noise). The delay in the output signal 20 and the subtracted quantization error constitutes a single sample time. As the sample rate increases with respect to the frequency of input signal 10, the delayed version of the quantization error approaches the current version of the quantization error and the difference between the two becomes very small. The error whose frequency is low enough for this to work is called in band noise. In this way, error is suppressed as sampling frequency increases while the signal is passed through with no compression. This noise suppression in the pass-band is called noise shaping.

In some implementations, DSM 110 can fit within an imaging pixel, with or without digital filter 120 and decimator 130. See, for example, U.S. Pat. No. 5,248,971, issued on Sep. 28, 1993 to Mandl. These modulators are very useful for creating image sensors with a high dynamic range. FIG. 2 illustrates a conventional DSM 200 which can be implemented completely inside an imaging pixel. See, for example, Boyd Fowler, *CMOS Area Image Sensors with Pixel Level A/D Conversion*, Ph.D. Dissertation, Stanford University, October 1995, at page 65 and FIG. 6.1. As shown in FIG. 2, in-pixel DSMs can comprise an integrator circuit 210 including an integration capacitor 215 (having a capacitance of Cint) that receives analog signals from an input circuit 205, a comparator (or single-bit ADC) 220, and a charge subtraction circuit (or single-bit DAC) 230.

$\Delta\Sigma$ digital pixel modulators have some useful features. The first feature is that DSM pixels are very compatible with Extended Counting. Extended Counting is a technique to pull out additional information from the charge left on integration capacitor 215 after the last modulator sample operation. This is adapted for $\Delta\Sigma$ image sensors using a first order modulator followed by a successive approximation residue conversion. See, for example, Christer Jansson, "A high-resolution, compact, and low-power ADC suitable for array implementation in standard CMOS," IEEE Trans. on Cir. and Sys.-1: Fund. Theory and Apps., vol. 42, no. 11, November 1995. This approach has achieved 16 bits of resolution with 0.41 LSBs of noise without any trimming or correction.

Another useful feature is that the $\Delta\Sigma$ algorithm can filter or cancel comparator error from the operation of 1-b ADC 220, if there is a large number of samples or if Extended Counting is employed. This allows a much smaller and lower power comparator to be used as the decision circuit compared to some of the other high dynamic range modulation schemes used in-pixel, such as pulse frequency modulators (PFM). Comparators as simple as an inverter can be employed in the DSM pixel and still achieve good performance. The rejection of comparator error makes the $\Delta\Sigma$ circuit relatively immune to comparator power supply variation and even comparator decision level variation for large numbers of samples or with Extended Counting operation. The $\Delta\Sigma$ pixel's full-scale range must simply be large enough to contain the error without saturating or shutting off its components.

Another advantage of the $\Delta\Sigma$ digital pixel over some other modulators (e.g., pulse-frequency modulation or PFM) is its synchronous nature. At first glance, this might appear to be a disadvantage because PFM is capable of accepting extremely high input magnitudes, limited only by the oscillator's loop time constant or by practical issues, such as supply management and power consumption. However, the synchronous nature of the $\Delta\Sigma$ digital pixel allows many of the DSM components to be integrated outside the pixel. This allows the architecture to be used in much smaller pixels at the cost of synchronous array clocks running at the global or, as is more common, the row level.

In another implementation, an approach similar to FIG. 2 has been developed with the ADC circuitry being moved outside of the imaging pixel. See, for example, U.S. Pat. No. 5,659,315, issued on Aug. 19, 1997 to Mandl at FIGS. 13 and 15-17. This implementation still requires a similar charge subtraction circuit and a high gain transimpedance amplifier integrator to act as the modulator integrator and reference for the 1-b DAC.

Other more recent DSM approaches move most of the circuitry outside of the imaging pixel, except for a portion of the integrator and charge subtraction circuit, so as to reduce pixel size and power consumption. See, for example, U.S. Pat. No. 7,023,369, issued on Apr. 4, 2006 to Bocko et al. Instead of a fixed packet of charge transferred at high speed as shown in FIG. 2, the charge subtraction circuit in this approach is reconstructed to be a fixed current over the pixel access time. In this manner, the pixel size can be greatly reduced, but there are a number of key problems remaining with all of these approaches, which can be addressed by the circuit of the present disclosure.

DSMs are usually used to increase the dynamic range of image sensors. For many applications, they should be capable of integrating very high signal current in a short amount of time using a fast modulator sample rate. The circuit in FIG. 2 cannot operate nearly as fast as required by some applications. The 1-b DAC 230 is capable of pulling charge off the input node of amplifier 217 at very high speed, but amplifier 217 must work even faster to compensate for this high speed charge transfer or risk changing the bias on the detector too much. This detector bias spike may not be a problem for very high impedance silicon detectors, but it is a huge problem for infrared and scientific detector materials which may have very low impedance. These detectors produce vastly different signal currents under the same light conditions if the bias voltage across them changes too much. This is very difficult to calibrate out of an image and may severely limit performance of a sensor system.

The charge transfer mechanism of 1-b DAC 230 can also be problematic when there is a large array of modulators operating in parallel. The charge transfer circuit can reset in a closed-loop fashion, using PHI2, without disturbing the Gnd level very much. However, as soon as PHI1 closes to transfer charge off the integrator input node, the rush of current can cause a severe positive voltage spike in the ground connection. For this reason, some designs limit the current through the PHI1 charge transfer switch to help minimize this supply spike. This effect slows the rate at which the circuit can complete a charge transfer operation and places an upper limit on DSM sample rate. A slower sample rate may also prevent the circuit from working with very high signal levels over a very short integration time for a particular DSM resolution.

An array of DSMs working together may be clocked in a row-wise or column-wise fashion, with only a few rows or columns being clocked at once. This helps prevent supply spiking from all modulators trying to run a sample at one time. The clocks can scan through the array of modulators and complete a single sample clock cycle for all modulators. Each modulator has only a very short amount of time to complete its charge transfer operation before the clock is moved to a different group of modulators. This means that waiting for a controlled charge transfer in order to not spike Gnd or adversely bias the detector greatly slows down the maximum speed of the clock, limiting the minimum signal integration time. The modulator has much more time to reset the transferred charge mechanism than it does to actually perform the charge transfer.

The approach, as disclosed in U.S. Pat. No. 7,023,369 to Bocko et al., is targeted at reducing the circuit size to make the modulator compatible with small pixel image sensors. It partially solves the large array power consumption problem by keeping all active DC power consuming circuitry outside the pixel. However, it creates even bigger problems for high speed integration and high signals, because the integrated voltage must fully settle on high capacitance readout lines, which are shared by many pixels, in order to properly subtract a fixed amount of current from the accessed pixel. Signal subtraction schemes such as this using current as the subtracted signal over a fixed time interval (as opposed to charge transfer mechanisms) are also more susceptible to modulator clock jitter, because this jitter is directly injected into the magnitude of the subtracted signal. Running the modulator clock faster to achieve fast integration times for a given ADC resolution exacerbates this problem by increasing the magnitude effect of clock jitter on the subtracted signal magnitude. This uncertainty results in higher modulator noise and lower over-all signal-to-noise ratio for a particular modulator oversampling ratio.

SUMMARY

In accordance with one aspect, the present disclosure provides an electronic circuit having a first node, a second node, and a third node. The electronic circuit comprises: a first capacitor electrically coupled between the first and second nodes; a second capacitor electrically coupled between the second and third nodes; a dynamic resistance element electrically coupled between the first and third nodes for receiving a current input signal from the third node, wherein the dynamic resistance element is configured to have a variable resistance that changes in accordance with a voltage difference across the dynamic resistance element; a charge transfer switch electrically coupled between the first node and the dynamic resistance element to enable charge transfer from the first capacitor to the third node through the dynamic resistance element when the charge transfer switch is closed; a recharge circuit electrically coupled across the first capacitor to recharge the first capacitor to a common voltage when the charge transfer switch is open; and a comparator having a first terminal electrically coupled to the second node, a second terminal electrically coupled to a reference voltage, and an output terminal electrically coupled to the charge transfer switch.

In one embodiment, the variable resistance, when measured from the first node, changes dynamically as a function of a voltage at the first node and reaches a high resistance state when the voltage at the first node changes to a predetermined value. In one embodiment, the variable resistance, when measured from the third node, remains at a high resistance state while a voltage at the first node varies.

In one embodiment, the dynamic resistance element comprises a gain-boosted transistor element operable at transistor non-linear regions such that, when the charge transfer switch is closed, a source resistance of the gain-boosted transistor element remains at a low value and increases to a high value as a voltage at the first node changes to a predetermined level such that almost no current is conducted through the gain-boosted transistor element.

In one embodiment, the comparator is controlled by a first clock signal, the recharge circuit is controlled by a second clock signal, and the first and second clocks are non-overlapping. In one embodiment, the first clock is ON when the second clock is OFF.

In one embodiment, an amount of the charge transferred to the third node corresponds to a conductive range of the dynamic resistance element multiplied by a capacitance value of the first capacitor. In one embodiment, an analog residue at the third node changes by a ratio of a capacitance value of the first capacitor to a capacitance value of the second capacitor, multiplied by the conductive range. In one embodiment, the analog residue is passed to a down-stream circuit for extended counting operation.

In one embodiment, the dynamic resistance element comprises: a first transistor having a first gate electrically coupled to a bias voltage, a first drain, and a first source electrically coupled to a ground; a second transistor having a second gate electrically coupled to a first terminal of the dynamic resistance element, a second source electrically coupled to a supply voltage, and a second drain electrically coupled to the first drain; and a third transistor having a third gate electrically coupled to the first drain and the second drain, a third source electrically coupled to the second gate, and a third drain electrically coupled to a second terminal of the dynamic resistance element.

In one embodiment, the supply voltage is equal to the common voltage. In another embodiment, the supply voltage is different from the common voltage.

In accordance with another aspect, the present disclosure provides an electronic circuit having a first node, a second node, and a third node. The electronic circuit comprises: a first capacitor electrically coupled between the first and second nodes; a second capacitor electrically coupled between the second and third nodes; a dynamic resistance element electrically coupled between the first and third nodes, wherein the dynamic resistance element is configured to have a variable resistance that changes in accordance with a voltage difference across the dynamic resistance element; a charge transfer switch electrically coupled between the first node and the dynamic resistance element to enable charge transfer from the first capacitor to the third node through the dynamic resistance element when the charge transfer switch is closed; a recharge circuit electrically coupled across the first capacitor to recharge the first capacitor when the charge transfer switch is open, wherein the recharge circuit comprises a reset switch electrically coupled to the first node and a limiter switch electrically coupled to the reset switch; and a comparator having a first terminal electrically coupled to the third node, a second terminal electrically coupled to a reference voltage, and an output terminal electrically coupled to the charge transfer switch.

In one embodiment, the first capacitor is electrically coupled to a first supply voltage from the first node through the reset switch and the limiter switch and electrically coupled to a second supply voltage from the second node. In one embodiment, the first supply voltage is different from the second supply voltage.

In one embodiment, the comparator is controlled by a first clock signal, the reset switch is controlled by a second clock signal, and the first clock is ON when the second clock is OFF.

In one embodiment, the variable resistance, when measured from the first node, changes dynamically as a function of a voltage at the first node and reaches a high resistance state when the voltage at the first node decreases to a predetermined value. In one embodiment, the variable resistance, when measured from the third node, remains at a high resistance state while a voltage at the first node varies.

In one embodiment, the dynamic resistance element comprises a gain-boosted transistor element operable at transistor non-linear regions such that, when the charge transfer switch is closed, a source resistance of the gain-boosted transistor element remains at a low value and increases to a high value as a voltage at the first node changes to a predetermined level such that almost no current is conducted through the gain-boosted transistor element.

In one embodiment, an amount of the charge transferred to the third node corresponds to a conductive range of the dynamic resistance element multiplied by a capacitance value of the first capacitor. In one embodiment, an analog residue at the third node changes by a ratio of a capacitance value of the first capacitor to a capacitance value of the second capacitor, multiplied by the conductive range. In one embodiment, the analog residue is passed to a down-stream circuitry for extended counting operation.

In one embodiment, the dynamic resistance element comprises: a first transistor having a first gate electrically coupled to a bias voltage, a first drain, and a first source electrically coupled to a ground; a second transistor having a second gate electrically coupled to a first terminal of the dynamic resistance element, a second source electrically coupled to a supply voltage, and a second drain electrically coupled to the first drain; and a third transistor having a third gate electrically coupled to the first drain and the second drain, a third source electrically coupled to the second gate, and a third drain electrically coupled to a second terminal of the dynamic resistance element.

The present disclosure also provides a delta-sigma modulator circuit comprising the electronic circuit described above having first, second and third nodes, a digital filter circuit electrically coupled to the output terminal of the comparator, and a decimator circuit electrically coupled to the digital filter circuit for generating a digital output signal.

The present disclosure also provides an image sensor comprising an array of photosensitive pixels, each photosensitive pixel comprising a sensing transducer for generating the current input signal, and the delta-sigma modulator circuit described above electrically coupled to the sensing transducer for processing the current input signal from the sensing transducer. In one embodiment, the sensing transducer comprise a photon sensitive detector.

In accordance with a further aspect, the present disclosure provides an electronic circuit having a first node, a second node, and a third node. The electronic circuit comprises: a first capacitor electrically coupled between the first and second nodes; a second capacitor electrically coupled between the second and third nodes; a dynamic resistance element electrically coupled between the first and third nodes for receiving a current input signal from the third node, wherein the dynamic resistance element is configured to have a variable resistance that changes in accordance with a voltage difference across the dynamic resistance element; a charge transfer switch electrically coupled between the first node and the dynamic resistance element to enable charge transfer from the first capacitor to the second capacitor when the charge transfer switch is closed; a recharge circuit electrically coupled across the first capacitor to recharge the first capacitor to a first supply voltage when the charge transfer switch is open; and a comparator having a first terminal electrically coupled to the third node, a second terminal electrically coupled to a reference voltage, and an output terminal electrically coupled to the charge transfer switch; wherein the dynamic resistance element is electrically coupled with a second supply voltage different from the first supply voltage.

The present disclosure also provides a delta-sigma modulator circuit comprising the electronic circuit described above having first, second, and third nodes, a digital filter circuit electrically coupled to the output terminal of the comparator, and a decimator circuit electrically coupled to the digital filter circuit for generating a digital output signal.

The present disclosure additionally provides an image sensor comprising an array of photosensitive pixels, each photosensitive pixel comprising a sensing transducer for generating the current input signal, and the delta-sigma modulator circuit described above electrically coupled to the sensing transducer for processing the current input signal from the sensing transducer. In one embodiment, the sensing transducer comprise a photon sensitive detector.

The present disclosure further provides a readout integrated circuit for processing input signals, the readout integrated circuit comprising: a first capacitor electrically coupled between a first node and a second node; a second capacitor electrically coupled between the second node and a third node; a dynamic resistance element electrically coupled between the first node and the third node, the dynamic resistance element being configured to have a variable resistance that changes in accordance with a voltage value at the first node; a charge transfer switch electrically coupled between the first node and the dynamic resistance element; a recharge circuit electrically coupled across the first capacitor; and a comparator having a first terminal electrically coupled to the third node, a second terminal electrically coupled to a reference voltage, and an output terminal electrically coupled to the charge transfer switch.

DETAILED DESCRIPTION

Figure 1:
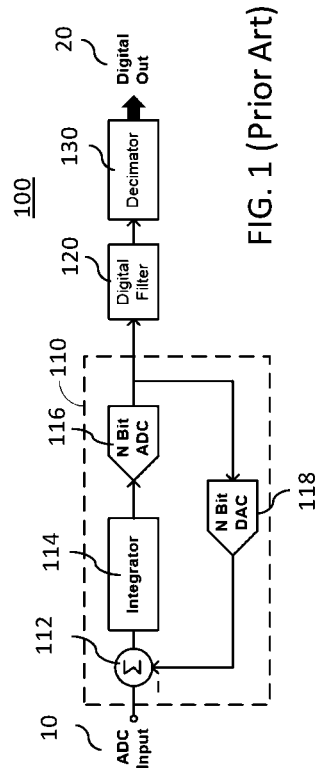
FIG. 1 illustrates a schematic circuit of a conventional ΔΣ-ADC.
Figure 2:
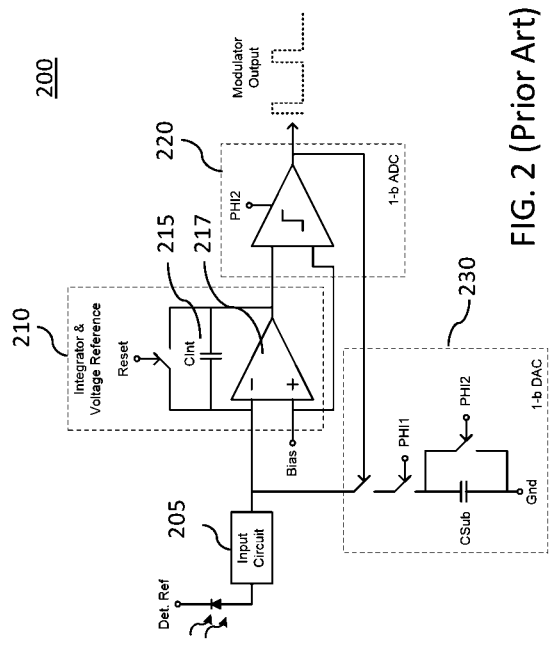
FIG. 2 illustrates a schematic circuit of another conventional DSM for pixel-level implementations.
Figure 3:
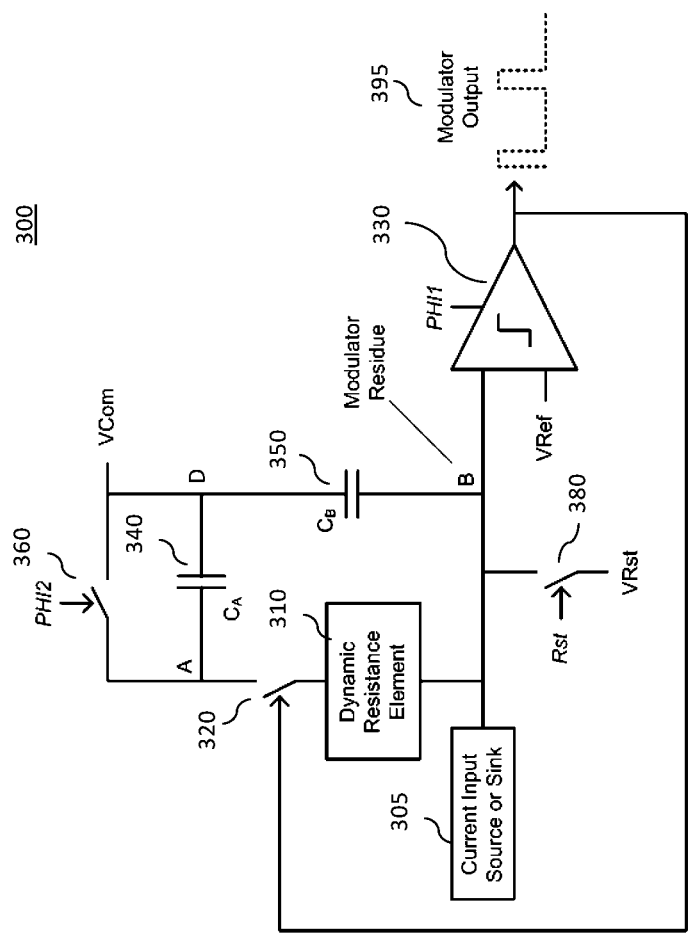
FIG. 3 illustrates a schematic circuit of a compact Delta-Sigma Modulator (DSM) using a Dynamic Resistance Element (DRE) for current inputs, in accordance with an embodiment of the present disclosure.

FIG. 3 illustrates a schematic circuit of a compact Delta-Sigma Modulator (DSM) including a Dynamic Resistance Element (DRE) (hereafter, DRE-DSM 300) for current inputs, in accordance with an embodiment of the present disclosure. As shown in FIG. 3, DRE-DSM 300 includes a charge transferring Delta circuit (i.e., the circuit between nodes A, B, and D) based upon a dynamic resistance element (DRE) 310 which is used in place of the active amplifier and the voltage reference as discussed above for FIG. 2.

Referring to FIG. 3, DRE-DSM 300 includes DRE 310 electrically coupled between nodes A and B that receives signals from a current input 305 at node B, a charge transfer capacitor 340 (having a capacitance $C_A$) electrically coupled between nodes A and D, and an integration capacitor 350 (having a capacitance $C_B$) electrically coupled between nodes B and D. In various embodiments, current input 305 can be either a current sink or a current source, which may include a photosensitive imaging detector that generates electric currents in response to incident light (e.g., visible, infrared, ultraviolet, etc.).

DRE 310 is electrically coupled to node A through an enable switch 320 (or charge transfer switch) controlled by a comparator 330, which in turn is controlled by a clock PHI1. One input terminal of comparator 330 is coupled to node B, while the other input terminal of comparator 330 is electrically coupled to a reference voltage VRef, which can be set at somewhere between a common supply voltage VCom (for current sink input) and a common Ground (for current source input) (e.g., 0~3.3 Volts). Switch 320 connects DRE 310 into the charge transferring Delta circuit (i.e., the circuit between nodes A, B, and D) from node A so as to transfer charge from charge transfer capacitor 340 to integration capacitor 350 through DRE 310. This charge transfer can be positive or negative depending upon whether the current input to the system is a sink or a source, respectively.

A first reset switch 360 is electrically coupled across charge transfer capacitor 340 between nodes A and D, and is driven by a clock PHI2. Switch 360 can reset the charge on charge transfer capacitor 340 (after every transfer operation) in accordance with clock PHI2 which behaves in a non-overlapping manner with respect to clock PHI1. This reset operation transfers charge in a closed-loop manner and reduces the supply spiking on the common supply voltage VCom electrically coupled to node D.

A second reset switch 380 is electrically coupled to node B so as to reset the voltage at node B to a predetermined voltage VRst. Switch 380 can be controlled (opened or closed) by a reset signal Rst.

Figure 4:
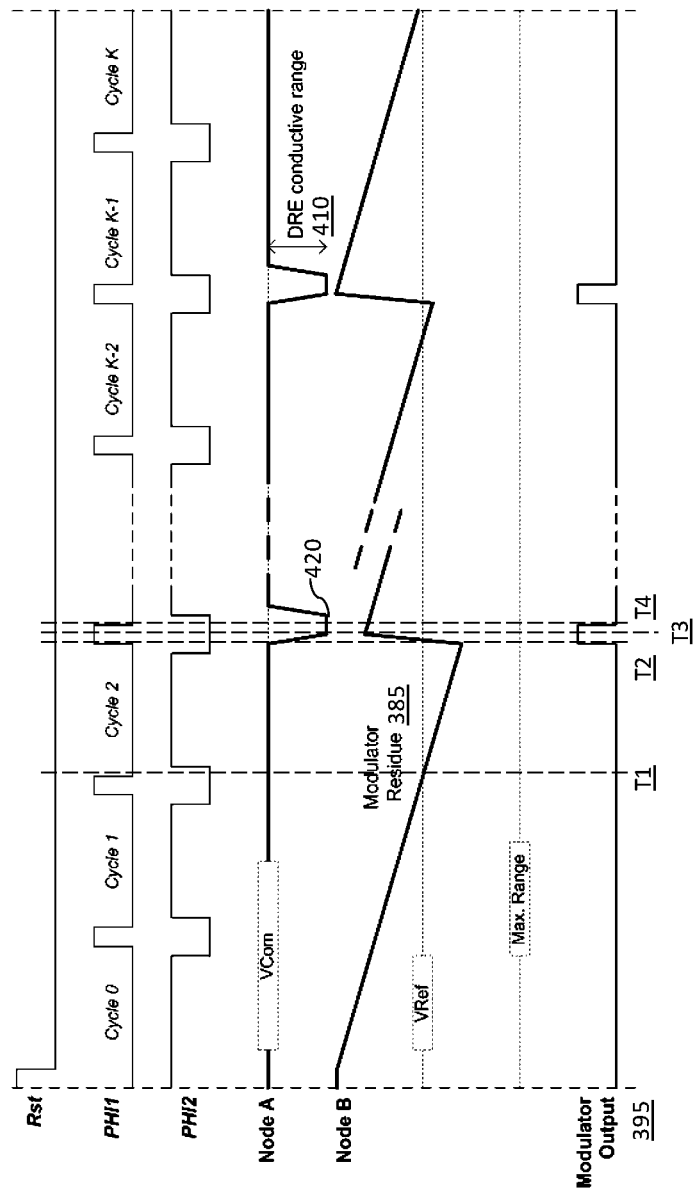
FIG. 4 illustrates exemplary waveforms for operating the DSM as shown in FIG. 3.

FIG. 4 illustrates relative voltage waveforms for operating DRE-DSM 300, as shown in FIG. 3. As shown in FIG. 4, reset signal Rst remains at the OFF state for the entire time period so as to keep switch 380 as being opened. Referring to both FIGS. 3 and 4, clocks PHI1 and PHI2 are non-overlapping clocks (i.e., clock PHI1 and PHI2 are never ON simultaneously) generated outside of DRE-DSM 300 and are respectively fed into comparator 330 and switch 360, to preserve the charge in the Delta circuit. For illustration purposes, K clock cycles are shown in FIG. 4, where K may be any integer value and is set based upon DSM resolution and sample rate requirements.

Node A is the charge transfer node and normally sits at common supply voltage VCom, because switch 360 is closed most of the time according to the waveform of clock PHI2 as shown in FIG. 4. These waveforms in FIG. 4 assume that current input 305 is a current sink on node B and that the integrated signal on node B integrates down until it passes reference voltage VRef on comparator 330 at time T1 and subsequently reaches a rising edge of clock PHI1 at time T2.

At time T2, comparator 330 is triggered in response to an ON state of clock PHI1, which closes switch 320. As a result, charge is dumped from the recharge state of common supply voltage VCom into the integration node B through DRE 310, until the voltage at node A reaches a low enough value (e.g., 2 to 3 Volts in a 3.3 V supply, depending upon the ratio of $C_A$ to $C_B$) at time T3, which shuts off DRE 310. This provides a pulse on DSM output 395, between a rising edge of clock PHI1 at time T2 and a falling edge of clock PHI1 at time T4.

These internal nodes A, B, and D settle extremely fast, primarily due to the high bandwidth of DRE 310 and the fact that the charge transfers between two different capacitors 340 and 350 on the same common supply voltage VCom. Using the same supply voltage VCom provides a closed-loop charge transfer operation that prevents the majority of common supply voltage VCom spikes as in the transfer capacitor 340 reset condition. The amount of charge transferred to node B corresponds to the DRE conductive range 410 multiplied by the capacitance value $C_A$. Consequently, the voltage change on the modulator residue 385 at node B is the ratio of capacitance value $C_A$ to capacitance value $C_B$ multiplied by the DRE conductive range 410. FIG. 4 illustrates results for a ratio of $C_A$ to $C_B$ slightly greater than 1.

Figure 5:
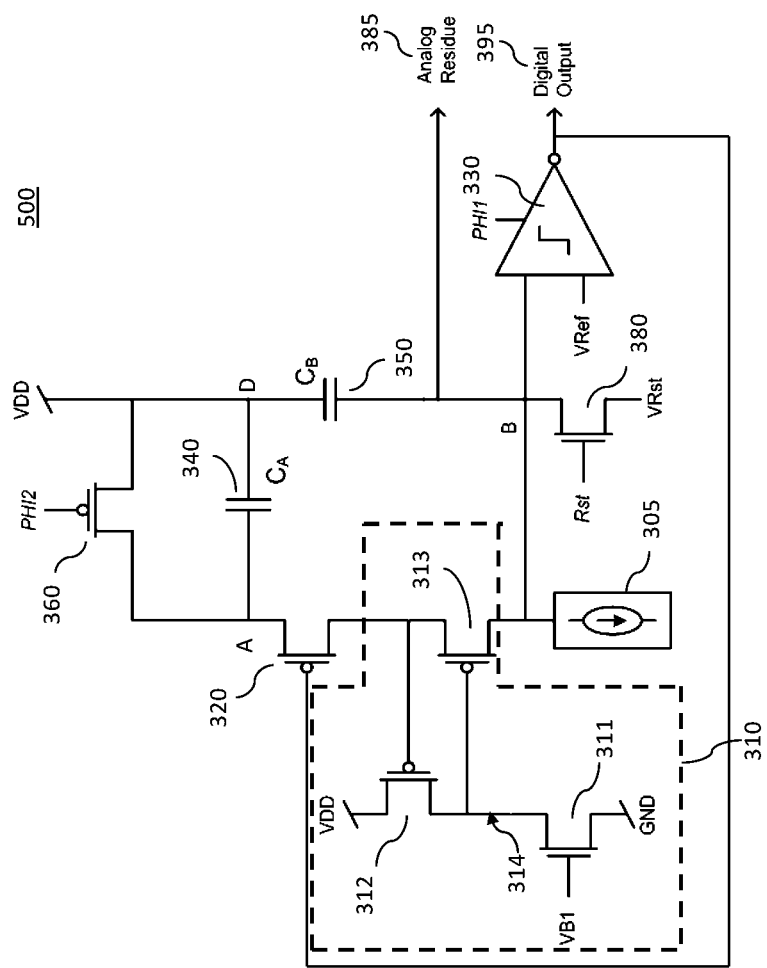
FIG. 5 illustrates a schematic circuit of DRE-DSM, in accordance with an embodiment of the present disclosure.

FIG. 5 illustrates a schematic circuit of a DRE-DSM 500 in accordance with an embodiment of the present disclosure. As shown in FIG. 5, DRE-DSM 500 is created using common Metal Oxide Semiconductor Field Effect Transistors (MOSFETs) for a current sink signal input 305. In this embodiment, switches 320 and 360 comprise P-type MOSFETs. It is appreciated that, in other embodiments, N-type MOSFETs can be used for switches 320 and 360. Further, in this embodiment, common supply voltage VCom is a high potential VDD (e.g., 3.3 Volts).

Referring to FIG. 5, DRE 310 can be made using a gain-boosted MOSFET configuration (also called a regulated cascode) comprising transistors 311, 312, and 313. The gate of transistor 311 is electrically coupled to bias voltage VB1 which is typically generated using a so-called diode-connected MOSFET in a current mirror configuration (e.g., 0.5 to 1.2 Volts), and the source of transistor 311 is electrically coupled to the ground (Gnd). The drain of transistor 311 is electrically coupled to the drain of transistor 312 and the gate of transistor 313. The gate of transistor 312 is electrically coupled to the source of transistor 313 and the drain of transistor 320. The source of transistor 312 is electrically coupled to high voltage VDD. The drain of transistor 313 is electrically coupled to node B. In this embodiment, transistor 311 is an N-type MOSFET while transistors 312 and 313 are P-type MOSFETs. It is appreciated that depending on, design choices, either P-type or N-type MOSFETS can be used for transistors 311, 312, and 313. It is further appreciated that the source and the drain of transistors 311, 312, and 313 may be interchanged based on design choices.

The output resistance of DRE 310 looking back from node B in the circuit is very high and is boosted by the gain of the circuit leg 314 made up of transistors 311 and 312. Conversely, the resistance of DRE 310 looking into the source of transistor 313 is very low and is reduced by the gain factor from transistors 311 and 312. This is the case as long as the voltage on the source of transistor 313 is high, which will be the case immediately after node A is connected through switch transistor 320 allowing current to flow through the transistor 313. Transistor 313 may also be referred to as a gain-boosted transistor operable at transistor non-linear regions such that a source resistance of transistor 313 starts out at a low value (e.g., <100 kOhms) when the charge transfer switch is closed, and increases to a high value (e.g., >10 GOhms) as the voltage at node A decreases to a pre-determined level, such that almost no current is conducted through transistor 313.

At the time immediately after switch 320 closes, the gate of transistor 312 is pulled to node A, limited only by how fast switch 320 can transfer charge between the two nodes. This voltage movement passes through the negative gate to drain transfer function of transistor 312 and causes the voltage of the drain of transistor 312 and 311 and the gate of transistor 313 to start to drop. Meanwhile, current begins to flow from node A to node B through transistor 313. As the common node of active leg 314 continues to fall, transistor 313 is driven into a highly conductive mode. The common node of active leg 314 is typically much faster compared to node A, due to the low capacitance associated with this node. Nevertheless, this common node may slightly lag in time from the activity on the gate of transistor 312. This time delay is the common active amplifier delay associated with the transconductance of transistor 312 and the capacitance associated with the common node of the active leg 314.

As node A drops to a lower voltage while dumping charge to node B, transistor 313 quickly enters the sub-threshold region and is driven into an OFF state. This is because the amplifier leg made out of transistors 311 and 312 continues to overdrive the gate of transistor 313 and pull node A deep into transistor 313's sub-threshold region and firmly into what can be considered OFF. This is the key to providing a flat pedestal 420 on the DRE conductive range 410 as shown in FIG. 4 and also provides some noise advantages in this state by band-limiting the signals that can pass through to node B. The DRE conductive range 410 may be modified by adjusting the bias current through the gain leg 314 of transistors 311 and 312, which in turn adjusts the source to gate voltage drop on transistor 312. In one embodiment, the bias current can be adjusted using bias voltage VB1. Transistors 311 and 312 only need a small amount of bias current to provide this gain and these transistors can be made very small in physical sizes. No gain-boosted Miller compensation capacitance is required on this amplifier leg, because the circuit does not operate in the linear mode, but instead transitions to the OFF state immediately. This also reduces the noise contributions from transistors 311 and 312 on the magnitude of transferred charge.

Bias voltage VB1 sets the current flow through active leg 314. This current flow sets the source to gate voltage drop on transistor 312, which in turn, sets the DRE conductive range. If both transistors 311 and 312 are designed to be in strong inversion, then the DRE conductive range may vary directly with the value of VB1 and the current flowing through the active leg 314 may vary by the square of VB1. However, it is not necessary to design both transistors 311 and 312 in strong inversion. Instead, if transistor 311 is designed for strong inversion and transistor 312 is designed for sub-threshold operation, then the current through the active leg 314 may vary by the square of VB1, but the resultant source to gate voltage drop on transistor 312 may only vary logarithmically with this current, providing a rejection of VB1 variation to DRE conductive range modulation. Typically, VB1 is provided using a diode connected MOSFET in a current mirror configuration with transistor 311.

As shown in FIG. 5, DRE-DSM 500 further includes a reset transistor 380. A drain of transistor 380 is electrically coupled to node B. A source of transistor 380 is electrically coupled to a reset voltage VRst. A gate of transistor 380 is electrically coupled to a reset signal, Rst. By applying a proper reset signal Rst, transistor 380 can be turned on so as to reset the voltage at node B to the reset voltage VRst (e.g., 1.5~2 Volts).

The remaining circuitry of DRE-DSM 500 operates exactly the same as that described above with respect to FIG. 3. Each modulator output pulse can be passed to a filter and decimator digital back-end and, after K clock cycles, the modulator residue 385 left on node B can be passed down to a follow-on modulator or out to other circuitry for Extended Counting. See, for example, Christer Jansson, "A high-resolution, compact, and low-power ADC suitable for array implementation in standard CMOS," IEEE Trans. on Cir. and Sys.-1: Fund. Theory and Apps., vol. 42, no. 11, November 1995.

Figure 6:
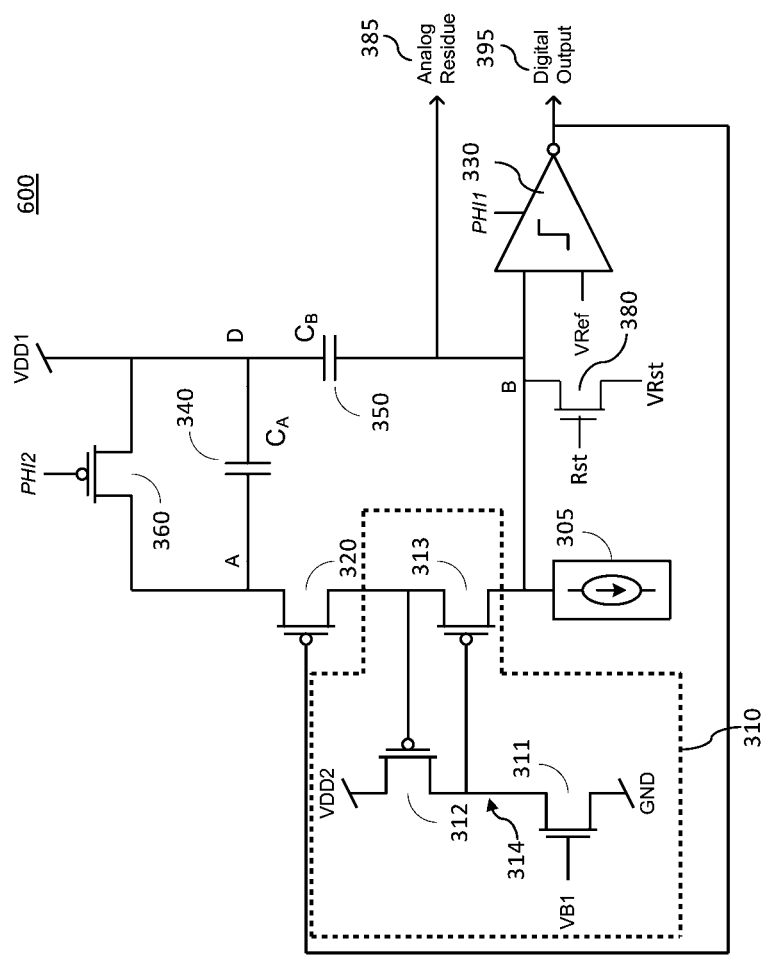
FIG. 6 illustrates a schematic circuit of DRE-DSM with separate reference supplies for widely adjustable charge transfer packets, in accordance with an embodiment of the present disclosure.

FIG. 6 illustrates a schematic circuit of DRE-DSM 600 with separate reference supplies for widely adjustable charge transfer packets, in accordance with an embodiment of the present disclosure. As shown in FIG. 6, DRE-DSM 600 is substantially the same as DRE-DSM 500 of FIG. 5, except that, in this embodiment, supply voltage VDD at node D and at the source of transistor 312 are separated into two different supply voltages VDD1 and VDD2. This provides variable charge transfer by adjusting the DRE conductive range 410 as a function of the difference between supply voltages VDD1 and VDD2. This can be a useful way to optimize modulator charge transfer rates and ranges. The DRE conductive range increases linearly and equivalently/proportionally with the difference between VDD1 and VDD2. This is because the DRE conductive pedestal 420 is dependent only upon the active leg 314 which drives the gate voltage of transistor 313 and this final resting voltage is not a function of the starting point of node A set by VDD1.

Figure 7:
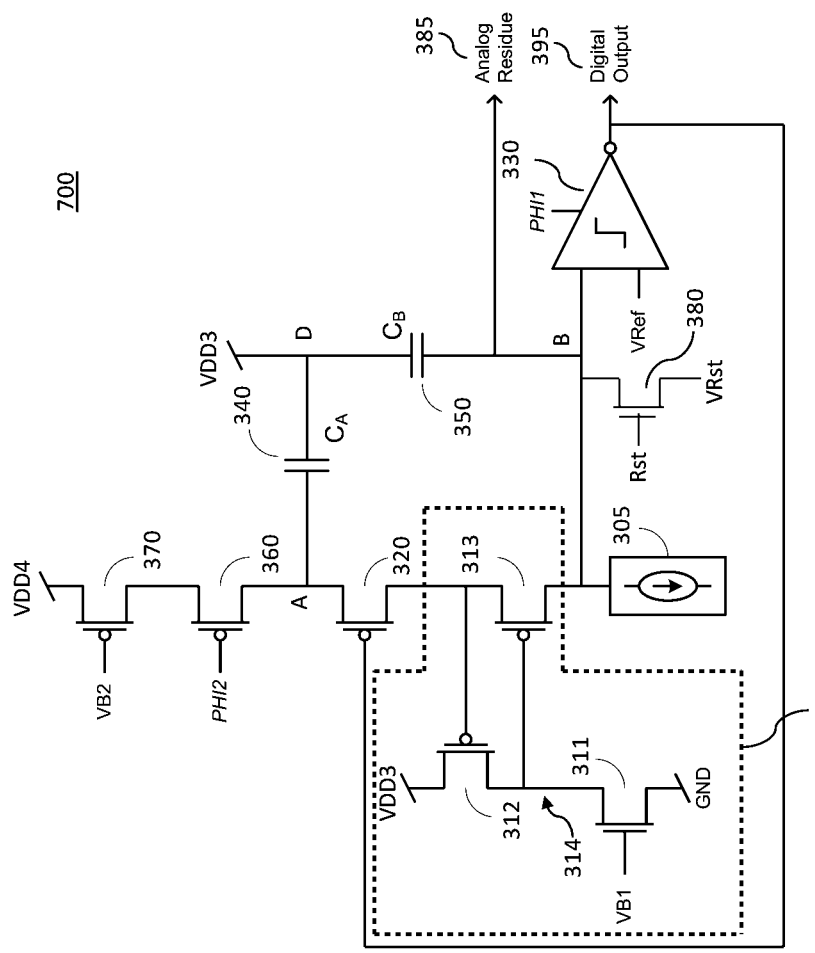
FIG. 7 illustrates a schematic circuit of DRE DSM with separate reference supplies for widely adjustable charge transfer packets and controlled rate reset of the charge transfer capacitor, in accordance with an embodiment of the present disclosure.

FIG. 7 illustrates a schematic circuit of DRE-DSM 700 with separate reference supplies for widely adjustable charge transfer packets and controlled rate reset of charge transfer capacitor, in accordance with an embodiment of the present disclosure. As shown in FIG. 7, DRE-DSM 700 is substantially the same as DRE-DSM 500 of FIG. 5, except that, in this embodiment, supply voltages VDD at node D and at the source of transistor 312 in FIG. 5 remain the same and now denoted as supply voltages VDD3 in FIG. 7, while the charge transfer capacitor 340 is reset to an independent supply voltage VDD4.

Like DRE-DSM 600 of FIG. 6, DRE-DSM 700 also allows independent control of the DRE conductive range 410. As shown in FIG. 7, the gate of transistor 311 is electrically coupled to a first bias voltage VB1, the gate of transistor 370 is electrically coupled to a second bias voltage VB2, the source of transistor 370 is electrically coupled to supply voltage VDD4, and the drain of transistor 370 is electrically coupled to the source of switch 360. Under the configuration of FIG. 7, an additional transistor 370 is added to the circuit as a controlled recharge current limiter switch, which limits current using bias voltage VB2.

The DRE conductive range can vary linearly with the difference between VDD4 and VDD3. Bias voltage VB2 in FIG. 7 can set the slew rate of the voltage on node A when it changes from the DRE conductive pedestal 420 back up to the value of VDD4. This slew rate can vary by the square of the voltage VB2 with respect to VDD4. This slew rate limiter is useful for large arrays of elements by preventing crosstalk through modulation of the DRE conductive ranges of neighboring elements.

Figure 8:
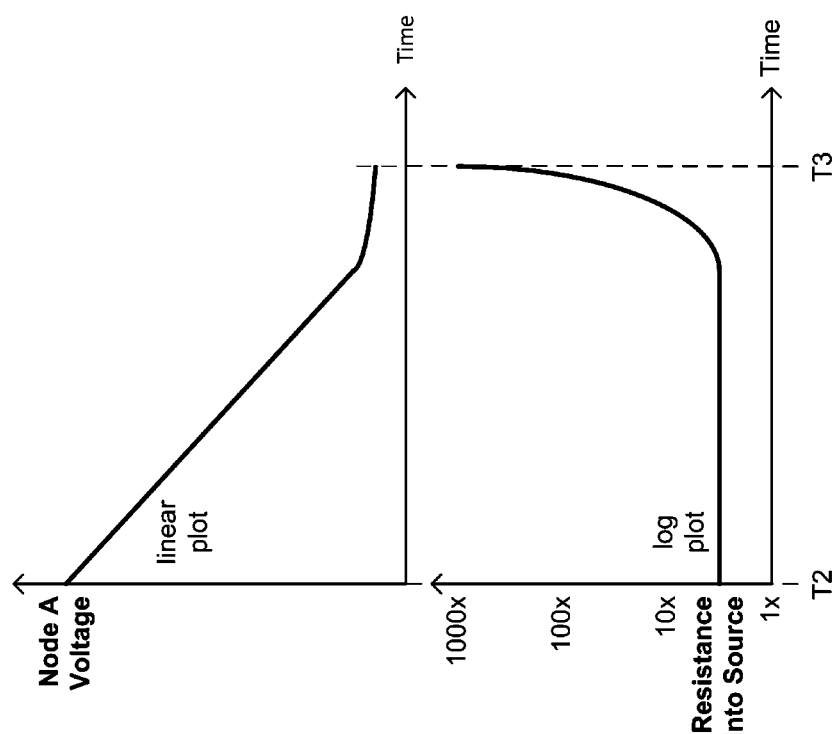
FIG. 8 schematically illustrates the comparison of resistance changes of DRE between times T2 and T3 in FIG. 4, and voltage changes at node A, in accordance with an embodiment of the present disclosure.
Figure 9:
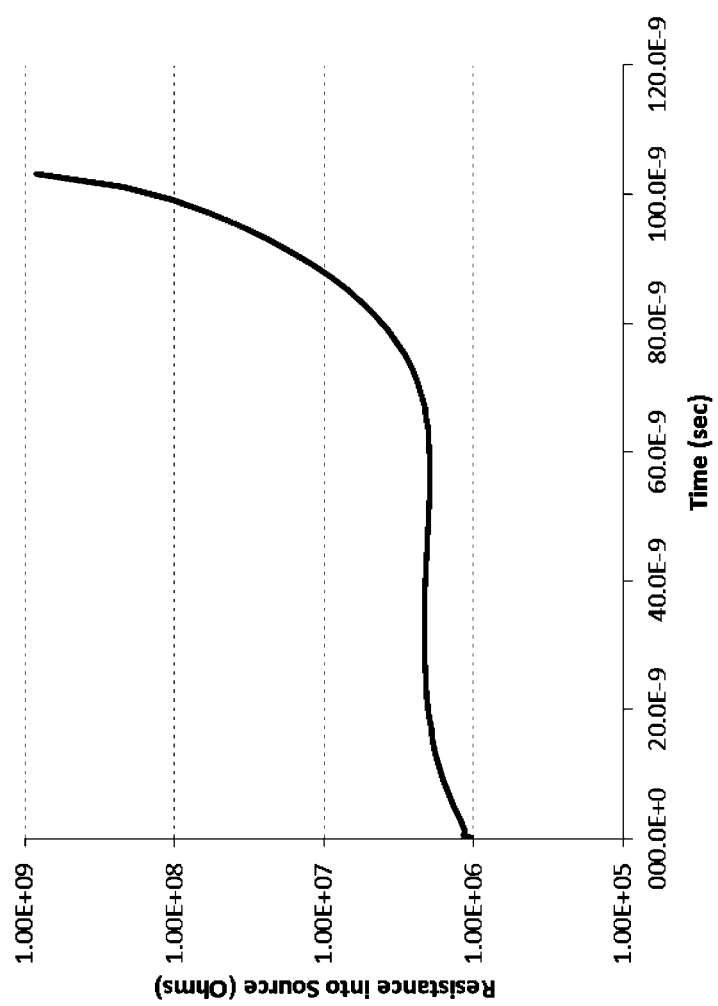
FIG. 9 schematically illustrates a log-linear plot of high order resistance changes of the DRE over a very short period of time, in accordance with an embodiment of the present disclosure.

FIG. 8 schematically illustrates a comparison of the resistance changes of DRE 310 between times T2 and T3 shown in FIG. 4, and the voltage changes at node A, in accordance with an embodiment of the present disclosure. FIG. 9 schematically illustrates a log-linear plot of high order resistance changes of the DRE 310 over a very short period of time (e.g., 100 nanoseconds), in accordance with an embodiment of the present disclosure. Referring to both FIGS. 8 and 9, as the voltage at node A continue to drop linearly, the resistance into source of DRE 310 remains at a constant small value (e.g., 100 Ohms up to $10 \times 10^6$ Ohms), depending upon the design of the circuit. As the voltage at node A drops to below a certain value (e.g., 2~2.5 Volts), the resistance into source of DRE 310 rapidly increases at least three orders of magnitude within about 10~20 nanoseconds.

There are several notable benefits of the disclosed modulators. They mostly solve the high power problem for large arrays and large format DSM image sensors, because the active legs of transistors 311 and 312 can have extremely low bias currents which do not need to scale up for larger signal currents. Eliminating the active amplifier also means these modulators can collect higher signals over shorter integration times as compared to the prior art. This decoupling of architecture power consumption and collection of high magnitude signals is not possible with conventional synchronous DSM architectures because the amplifier power must scale with the integrated signal current. These new modulators also can be included in a smaller circuit layout area and can have smaller devices in the bias leg compared to an active amplifier solution from the prior art. This is because the bias leg does not need to have such low 1/f noise or good uniformity compared to an active amplifier.

The present disclosure provides a Delta circuit and integrator for use in minimal-sized modulators which can provide much faster integration and lower power for Delta Sigma Modulators (DSMs). The compact size, high speed charge transfer, and low supply spiking capabilities of the disclosed circuit can be integrated within arrays of elements, such as, column-parallel analog-to-digital converter array, an array of image sensing pixels, or an array of unit cells for hybrid infrared sensor chip assemblies.

The disclosed circuit is designed for current inputs which are common in sensing elements, such as photodiodes and resistance-based sensors. It is appreciated that current inputs can be generated from other electrical stimuli through voltage or charge to current converters when the disclosed circuit is not utilized with current generating sensor elements.

Further, the present disclosure provides a mechanism to transfer a fixed packet of charge off a capacitor using an electrical circuit element which dynamically changes resistance based upon the voltage across it. Upon the beginning of the charge transfer, the dynamic resistance element (DRE) has very low resistance and charge freely transfers through the element at a high rate. As the voltage across the dynamic resistance element changes and reaches a pre-determined state, the resistance of the DRE increases rapidly to the point where charge transfer is effectively eliminated regardless of the voltage drop across the resistance element. This mechanism replaces the "1-b DAC" 230 and the active amplifier and reference shown as "Integrator & Voltage Reference" 210 in FIG. 2 to provide a fixed charge transfer. The magnitude of transferred charge is a function of the size of the built-in low resistance region of the DRE.

The DRE-DSM of the present disclosure speeds up charge transfer, allowing higher DSM clock frequencies and higher conversion speeds or higher ADC resolution per conversion cycle. The DRE-DSM of the present disclosure virtually eliminates power supply spiking by transferring charge between two capacitors connected to the same supply or common reference voltage. The DRE can tolerate much lower power consumption and higher non-uniformity compared to the prior art active amplifiers used for DSM allowing the DRE-DSM circuitry to be integrated into a much smaller area and arrayed into thousands or millions of elements.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical value appearing in the present disclosure are deemed modified by a term of degree (e.g., "about"), thereby reflecting its intrinsic uncertainty.

Although various embodiments of the present disclosure have been described in detail herein, one of ordinary skill in the art would readily appreciate modifications and other embodiments without departing from the spirit and scope of the present disclosure as stated in the appended claims.

What is claimed is:

1. An electronic circuit having a first node, a second node, and a third node, the electronic circuit comprising:

a first capacitor electrically coupled between the first and second nodes;

a second capacitor electrically coupled between the second and third nodes;

a dynamic resistance element electrically coupled between the first and third nodes for receiving a current input signal from the third node, wherein the dynamic resistance element is configured to have a variable resistance that changes in accordance with a voltage difference across the dynamic resistance element;

a charge transfer switch electrically coupled between the first node and the dynamic resistance element to enable charge transfer from the first capacitor to the third node through the dynamic resistance element when the charge transfer switch is closed;

a recharge circuit electrically coupled across the first capacitor to recharge the first capacitor to a common voltage when the charge transfer switch is open; and a comparator having a first terminal electrically coupled to the third node, a second terminal electrically coupled to a reference voltage, and an output terminal electrically coupled to the charge transfer switch.

2. The electronic circuit of claim 1, wherein the variable resistance, when measured from the first node, changes dynamically as a function of a voltage at the first node and reaches a high resistance state when the voltage at the first node decreases to a predetermined value.

3. The electronic circuit of claim 1, wherein the variable resistance, when measured from the third node, remains at a high resistance state while a voltage at the first node varies.

4. The electronic circuit of claim 1, wherein the dynamic resistance element comprises a gain-boosted transistor element operable at transistor non-linear regions such that, when the charge transfer switch is closed, a source resistance of the gain-boosted transistor element remains at a low value and increases to a high value as a voltage at the first node decreases to a predetermined level such that almost no current is conducted through the gain-boosted transistor element.

5. The electronic circuit of claim 1, wherein the comparator is controlled by a first clock signal, the recharge circuit is controlled by a second clock signal, and the first and second clocks are non-overlapping.

6. The electronic circuit of claim 5, wherein the first clock is ON when the second clock is OFF.

7. The electronic circuit of claim 1, wherein an amount of the charge transferred to the third node corresponds to a conductive range of the dynamic resistance element multiplied by a capacitance value of the first capacitor.

8. The electronic circuit of claim 7, wherein a voltage change in an analog residue at the third node equals a ratio of a capacitance value of the first capacitor to a capacitance value of the second capacitor, multiplied by the conductive range.

9. The electronic circuit of claim 8, wherein the analog residue is passed to a down stream circuitry for extended counting operation.

10. The electronic circuit of claim 1, wherein the dynamic resistance element comprises:

a first transistor having a first gate electrically coupled to a bias voltage, a first drain, and a first source electrically coupled to a ground;

a second transistor having a second gate electrically coupled to a first terminal of the dynamic resistance element, a second source electrically coupled to a supply voltage, and a second drain electrically coupled to the first drain; and a third transistor having a third gate electrically coupled to the first drain and the second drain, a third source electrically coupled to the second gate, and a third drain electrically coupled to a second terminal of the dynamic resistance element.

11. The electronic circuit of claim 10, wherein the supply voltage is equal to the common voltage.

12. The electronic circuit of claim 9, wherein the supply voltage is different from the common voltage.

13. A delta-sigma modulator circuit comprising the electronic circuit of claim 1, a digital filter circuit electrically coupled to the output terminal of the comparator, and a decimator circuit electrically coupled to the digital filter circuit for generating a digital output signal.

14. An image sensor comprising an array of photosensitive pixels, each photosensitive pixel comprising a sensing transducer for generating the current input signal, and the delta-sigma modulator circuit of claim 13 electrically coupled to the sensing transducer for processing the current input signal from the sensing transducer.

15. The image sensor of claim 14, wherein the sensing transducer comprise a photon sensitive detector.

16. An electronic circuit having a first node, a second node, and a third node, the electronic circuit comprising:

a first capacitor electrically coupled between the first and second nodes;

a second capacitor electrically coupled between the second and third nodes;

a dynamic resistance element electrically coupled between the first and third nodes, wherein the dynamic resistance element is configured to have a variable resistance that changes in accordance with a voltage difference across the dynamic resistance element;

a charge transfer switch electrically coupled between the first node and the dynamic resistance element to enable charge transfer from the first capacitor to the third node through the dynamic resistance element when the charge transfer switch is closed;

a recharge circuit electrically coupled across the first capacitor to recharge the first capacitor when the charge transfer switch is open, wherein the recharge circuit comprises a reset switch electrically coupled to the first node and a limiter switch electrically coupled to the reset switch; and a comparator having a first terminal electrically coupled to the third node, a second terminal electrically coupled to a reference voltage, and an output terminal electrically coupled to the charge transfer switch.

17. The electronic circuit of claim 16, wherein the first capacitor is electrically coupled to a first supply voltage from the first node through the reset switch and the limiter switch and electrically coupled to a second supply voltage from the second node.

18. The electronic circuit of claim 17, wherein the first supply voltage is different from the second supply voltage.

19. The electronic circuit of claim 16, wherein the comparator is controlled by a first clock signal, the reset switch is controlled by a second clock signal, and the first clock is ON when the second clock is OFF.

20. The electronic circuit of claim 16, wherein the variable resistance, when measured from the first node, changes dynamically as a function of a voltage at the first node and reaches a high resistance state when the voltage at the first node decreases to a predetermined value.

21. The electronic circuit of claim 16, wherein the variable resistance, when measured from the third node, remains at a high resistance state while a voltage at the first node varies.

22. The electronic circuit of claim 16, wherein the dynamic resistance element comprises a gain-boosted transistor element operable at transistor non-linear regions such that, when the charge transfer switch is closed, a source resistance of the gain-boosted transistor element remains at a low value and increases to a high value as a voltage at the first node decreases to a predetermined level such that almost no current is conducted through the gain-boosted transistor element.

23. The electronic circuit of claim 16, wherein an amount of the charge transferred to the third node corresponds to a conductive range of the dynamic resistance element multiplied by a capacitance value of the first capacitor.

24. The electronic circuit of claim 23, wherein a voltage change in analog residue at the third node equals a ratio of a capacitance value of the first capacitor to a capacitance value of the second capacitor, multiplied by the conductive range.

25. The electronic circuit of claim 24, wherein the analog residue is passed to a down-stream circuitry for extended counting operation.

26. The electronic circuit of claim 16, wherein the dynamic resistance element comprises:
a first transistor having a first gate electrically coupled to a bias voltage, a first drain, and a first source electrically coupled to a ground;
a second transistor having a second gate electrically coupled to a first terminal of the dynamic resistance element, a second source electrically coupled to a supply voltage, and a second drain electrically coupled to the first drain; and
a third transistor having a third gate electrically coupled to the first drain and the second drain, a third source electrically coupled to the second gate, and a third drain electrically coupled to a second terminal of the dynamic resistance element.

27. A delta-sigma modulator circuit comprising the electronic circuit of claim 16, a digital filter circuit electrically coupled to the output terminal of the comparator, and a decimator circuit electrically coupled to the digital filter circuit for generating a digital output signal.

28. An image sensor comprising an array of photosensitive pixels, each photosensitive pixel comprising a sensing transducer for generating the current input signal, and the delta-sigma modulator circuit of claim 27 electrically coupled to the sensing transducer for processing the current input signal from the sensing transducer.

29. The image sensor of claim 28, wherein the sensing transducer comprise a photon sensitive detector.

30. An electronic circuit having a first node, a second node, and a third node, the electronic circuit comprising:
a first capacitor electrically coupled between the first and second nodes;
a second capacitor electrically coupled between the second and third nodes;
a dynamic resistance element electrically coupled between the first and third nodes for receiving a current input signal from the third node, wherein the dynamic resistance element is configured to have a variable resistance that changes in accordance with a voltage difference across the dynamic resistance element;
a charge transfer switch electrically coupled between the first node and the dynamic resistance element to enable charge transfer from the first capacitor to the second capacitor when the charge transfer switch is closed;
a recharge circuit electrically coupled across the first capacitor to recharge the first capacitor to a first supply voltage when the charge transfer switch is open; and
a comparator having a first terminal electrically coupled to the third node, a second terminal electrically coupled to a reference voltage, and an output terminal electrically coupled to the charge transfer switch;
wherein the dynamic resistance element is electrically coupled with a second supply voltage different from the first supply voltage.

31. A readout circuit for processing input signals, the readout circuit comprising:
a first capacitor electrically coupled between a first node and a second node;
a second capacitor electrically coupled between the second node and a third node;
a dynamic resistance element electrically coupled between the first node and the third node, the dynamic resistance element being configured to have a variable resistance that changes in accordance with a voltage value at the first node;
a charge transfer switch electrically coupled between the first node and the dynamic resistance element;
a recharge circuit electrically coupled across the first capacitor; and
a comparator having a first terminal electrically coupled to the third node, a second terminal electrically coupled to a reference voltage, and an output terminal electrically coupled to the charge transfer switch.

* * * * *